United States Patent [19]

Tran

[11] Patent Number: 5,036,229
[45] Date of Patent: Jul. 30, 1991

[54] LOW RIPPLE BIAS VOLTAGE GENERATOR

[75] Inventor: Dung Q. Tran, San Jose, Calif.

[73] Assignee: Gazelle Microcircuits, Inc., Santa Clara, Calif.

[21] Appl. No.: 381,566

[22] Filed: Jul. 18, 1989

[51] Int. Cl.[5] .......................... G06G 7/12; H03K 3/01
[52] U.S. Cl. .................................. 307/497; 307/110; 307/296.2
[58] Field of Search ............... 307/296.2, 110, 497, 307/264, 578; 363/60

[56] References Cited

U.S. PATENT DOCUMENTS

| | | | |
|---|---|---|---|
| 4,378,506 | 3/1983 | Taira | 307/296.2 |
| 4,433,253 | 2/1984 | Zapisek | 307/296.2 |
| 4,446,384 | 5/1984 | Taira | 307/296.2 |
| 4,485,433 | 11/1984 | Topich | 307/296.2 |
| 4,628,215 | 12/1986 | Lou | 307/304 |
| 4,656,369 | 4/1987 | Lou | 307/296.2 |
| 4,668,918 | 5/1987 | Adams | 328/155 |
| 4,736,121 | 4/1988 | Cini et al. | 307/296.2 |
| 4,807,104 | 2/1989 | Floyd et al. | 363/59 |
| 4,839,787 | 6/1989 | Kojima et al. | 363/60 |

Primary Examiner—Stanley D. Miller
Assistant Examiner—Richard Roseen
Attorney, Agent, or Firm—Skjerven, Morrill, MacPherson, Franklin & Friel

[57] ABSTRACT

A charge pump essentially incorporating parallel connections of low capacity charge pumps, where each low capacity charge pump is controlled by a clock signal, where the clock signal associated with a low capacity charge pump has a phase different than the other clock signals. Hence, the output of these essentially parallel connected charge pumps will have a ripple period which is a fraction of the period of any single clock signal, wherein the fraction is equal to 1/n, where n is the number of parallel low capacity charge pumps. This results in a ripple magnitude of 1/n that of charge pumps using a single clock source with identical input and output capacitance.

6 Claims, 5 Drawing Sheets

FIG. 10

LOW RIPPLE BIAS VOLTAGE GENERATOR

FIELD OF THE INVENTION

The present invention relates generally to bias voltage generators, also known as charge pumps, and more particularly to a charge pump for producing an output voltage having relatively low ripple when coupled to a resistive load.

BACKGROUND OF THE INVENTION

Charge pumps have been used to generate positive or negative bias voltages for biasing a substrate of an integrated circuit. The output voltage of a charge pump, however, may be used for any application where a voltage above a positive power supply voltage or a voltage below ground potential is necessary in an electrical circuit.

A simple prior art charge pump is shown in FIG. 1. The charge pump of FIG. 1 produces a negative voltage potential at its output for application to, for example, a substrate of an integrated circuit for biasing the substrate. In FIG. 1, clock signal CLK produces a square wave voltage varying between, for example, five volts and ground potential. When a HIGH CLK signal is applied to the upper plate of capacitor C1, an electric field is created across the plates of capacitor C1, and electrons are drawn through diode D1 to charge the bottom plate of capacitor C1 and create a state of equilibrium where the voltage across capacitor C1 is equal to approximately five volts minus the voltage drop across diode D1, or approximately 4.3 volts. At this point in the clock timing sequence, the voltage at node 1 (i.e., at the anode of diode D1) is at ground potential plus the diode drop across diode D1, or approximately 0.7 volts.

As clock signal CLK goes from a HIGH level to ground potential, the existing charge on the bottom plate of capacitor C1 will cause a potential to appear at node 1 equal to approximately 4.3 volts below ground potential, since the voltage across capacitor C1 must remain constant in accordance with the equation:

$$V = Q/C, \quad \text{(eq. 1)}$$

where,
V is the voltage across the capacitor;
Q is the charge on the plates of the capacitor; and
C is the capacitance of the capacitor.

This negative voltage at node 1 forward biases diode D2 and produces a voltage at the output of the charge pump equal to approximately 3.6 volts below ground potential, ignoring any effects of stray capacitance on node 1. Filtering capacitor $C_f$, coupled to the output of the charge pump, becomes charged to this negative voltage and supplies voltage and current to the load.

Since a typical load consists of a certain amount of resistance, the output voltage of the charge pump diminishes during each clock period due to the charge stored in capacitors C1 and $C_f$ being conducted through the resistive load. This resulting ripple can be decreased somewhat by using a larger capacitor for capacitor $C_f$.

FIG. 2 shows the level of the clock signal CLK, having a period T, applied to capacitor C1 in FIG. 1. The voltage at node 1 is also shown along with the output of the charge pump, ignoring the effects of any stray capacitance.

When the clock signal CLK goes LOW, the voltage at node 1 becomes negative, and capacitor C1 charges filter capacitor $C_f$, coupled between the output of the charge pump and ground. As this charge is conducted through the load, the negative output voltage rises toward ground potential until the clock signal again goes LOW to again allow capacitor C1 to charge filter capacitor $C_f$. As seen in FIG. 2, the ripple of the output voltage has a period equal to the period of the clock signal.

A modification of the charge pump of FIG. 1 is shown in FIG. 3, wherein a relatively high level of negative voltage can be achieved by incorporating additional stages of the charge pump. The operation of the charge pump of FIG. 3 regarding capacitor C1 and diodes D1 and D2 is identical to that described with respect to FIG. 1.

Capacitor C2 of FIG. 3 has its upper plate coupled to clock signal $\overline{CLK}$ so that when the charge on the bottom plate of capacitor C1 causes a negative potential to appear at node 2 (i.e., the bottom plate of capacitor C2) during a LOW CLK signal, clock signal $\overline{CLK}$ is at a HIGH value, causing the voltage developed across capacitor C2 to be increased by the negative voltage applied to the bottom plate of capacitor C2. When clock signal $\overline{CLK}$ then goes LOW, and clock signal CLK goes HIGH, the voltage at node 2 will be made further negative and will be applied to the bottom terminal of capacitor C3 at node 3.

Thus, as seen, the negative voltages at the various nodes becomes more negative toward the output of the charge pump so that the voltage across capacitor $C_n$ may be very high. Accordingly, capacitor $C_n$ must be designed to withstand a greater voltage than the preceding capacitors.

The output of the charge pump of FIG. 3 suffers the same disadvantage as the charge pump of FIG. 1 in that any resistive load coupled to the output of the charge pump of FIG. 3 will cause charge to be dissipated from capacitor $C_n$ and filtering capacitor $C_f$ during the clock cycle, resulting in the ripple of the output voltage having a period equal to the period of the clock signal.

Filter capacitor $C_f$ is needed to help supply voltage and current to the load during the time when clock signal $\overline{CLK}$, coupled to the top terminal of capacitor $C_n$, is HIGH. When $\overline{CLK}$ goes LOW, capacitor $C_f$ gets recharged by the change on the bottom plate of capacitor $C_n$.

It would be highly desirable for a circuit designer to use a charge pump having a very low ripple voltage without requiring the charge pump to incorporate capacitors having relatively high capacitance values.

SUMMARY OF THE INVENTION

The aim of the present invention is to provide a charge pump circuit which overcomes the disadvantages of the above-described prior art charge pumps. A particular object of the present invention is to provide a charge pump capable of supplying a DC voltage to a load, wherein the ripple of the output voltage can be made as low as desired without requiring relatively high value capacitors be used in the charge pump.

Broadly, the above object of the present invention is accomplished with a charge pump essentially incorporating parallel connections of low capacity charge pumps, where each low capacity charge pump is controlled by a clock signal having a phase different than the other clock signals.

In a single stage charge pump of this invention, each low capacity charge pump consists of a capacitor having a bottom plate coupled to an anode of an associated diode wherein a cathode of the diode is coupled to, for example, ground, along with the cathodes of diodes in the other parallel connected low capacity charge pumps. The bottom plate of the capacitor is also coupled to a cathode of an additional associated diode, with an anode of this additional associated diode being made common with the anodes of diodes in the other low capacity charge pumps. In this configuration, the anodes provide a negative output voltage to a load.

Each of the upper plates of the capacitors in each low capacity charge pump is coupled to a clock signal having a clock phase which is different than the other clock signals provided to the remaining capacitors.

Hence, the output of these essentially parallel connected charge pumps will have a ripple period which is a fraction of the period of any single clock signal, wherein the fraction is equal to 1/n, where n is the number of parallel low capacity charge pumps.

Further, since the amount of charge available at the output is a result of the combined charges on the bottom plates on all of the capacitors used in the charge pump of this invention, each capacitor may be made relatively small so that as the ripple of the output is desired to be made smaller, each capacitor may also be made smaller.

A wide range of voltage levels may be achieved by using low capacity charge pumps having multiple stages.

DETAILED DESCRIPTION OF THE INVENTION

Figure 4:
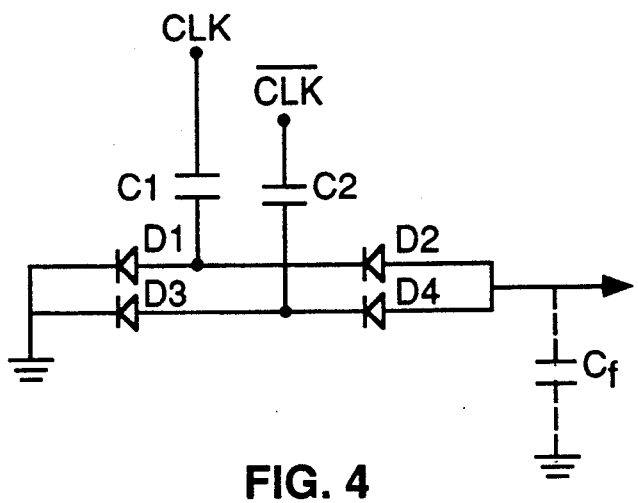
FIG. 4 shows one embodiment of the invention having one-half the output voltage ripple as that of the charge pump of FIG. 1.

FIG. 4 shows one embodiment of the invention. In FIG. 4, clock signal CLK, having a period T, is applied to the upper plate of capacitor C1, and the bottom plate of capacitor C1 is coupled to the anode of diode D1 and the cathode of diode D2. The cathode of diode D1 is coupled to ground, while the anode of diode D2 provides an output voltage to a load.

In parallel with the arrangement of capacitor C1 and diodes D1 and D2 is capacitor C2 and diodes D3 and D4, where the upper plate of capacitor C2 is coupled to clock signal $\overline{CLK}$. The cathodes of diodes D1 and D3 are made common and coupled to ground, and the anodes of diodes D2 and D4 are made common and provide the output voltage to a load.

Filter capacitor $C_f$ is shown in dashed outline coupled to the anodes of diodes D2 and D4. Filter capacitor $C_f$ may be a discrete capacitor, the parasitic capacitance of circuitry coupled to the anodes of diodes D1 and D4, or a combination of both. A relatively high filter capacitance is desirable in order to lower the magnitude of the ripple voltage, as will be discussed below.

In the configuration of FIG. 4, when each of the clock signals CLK and $\overline{CLK}$ alternately goes HIGH, a charge builds up on the bottom plates of capacitors C1 and C2, respectively. When each of clock signals CLK and $\overline{CLK}$ goes LOW, this built up charge on the bottom plates of the respective capacitors discharges through diode D2 or D4 and supplies voltage and current to a load coupled to the output.

Figure 1:
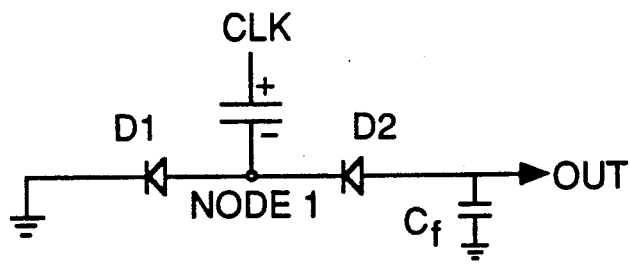
FIG. 1 shows a single stage prior art charge pump.
Figure 3:
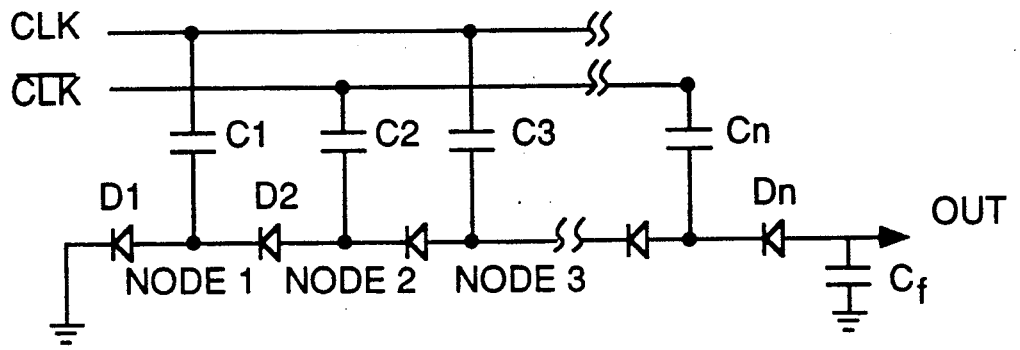
FIG. 3 shows a multiple stage prior art charge pump.
Figure 5:
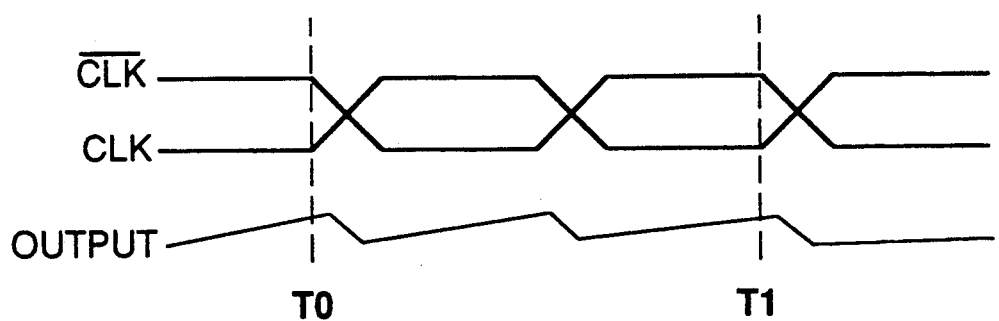
FIG. 5 shows the output voltage of the charge pump of FIG. 4.

Charge is restored on the bottom plates of each of capacitors C1 and C2 at alternate intervals. For example, during the time when the charge on the bottom plate of capacitor C1 is being drained through a load coupled to the output (i.e., during the time when CLK is LOW), the charge on the bottom plate of capacitor C2 is being restored by clock signal $\overline{CLK}$ being at a HIGH voltage. When clock signal $\overline{CLK}$ subsequently goes LOW, charge is now made available from capacitor C2 to the load coupled to the output. At this time, clock signal CLK is HIGH, as shown in FIG. 5, and capacitor C1 is recharged. Thus, during each period of clock signal CLK, capacitors C1 and C2 are each alternately charged and discharged, and each capacitor is only supplying charge to the output for one-half the period of clock signal CLK. Since filter capacitor $C_f$ is being recharged twice as often as the filter capacitor in FIGS. 1 and 3, and since typically $C_f$ is many times larger than C1 or C2 in FIG. 4 and the capacitors in FIGS. 1 and 3, the voltage ripple at the output of the charge pump is essentially one-half that of the voltage ripple at the outputs of the charge pumps of FIGS. 1 and 3, given identical filter capacitors $C_f$. If the capacitance of filter capacitor $C_f$ is made larger, the voltage ripple can be made even smaller.

Figure 2:
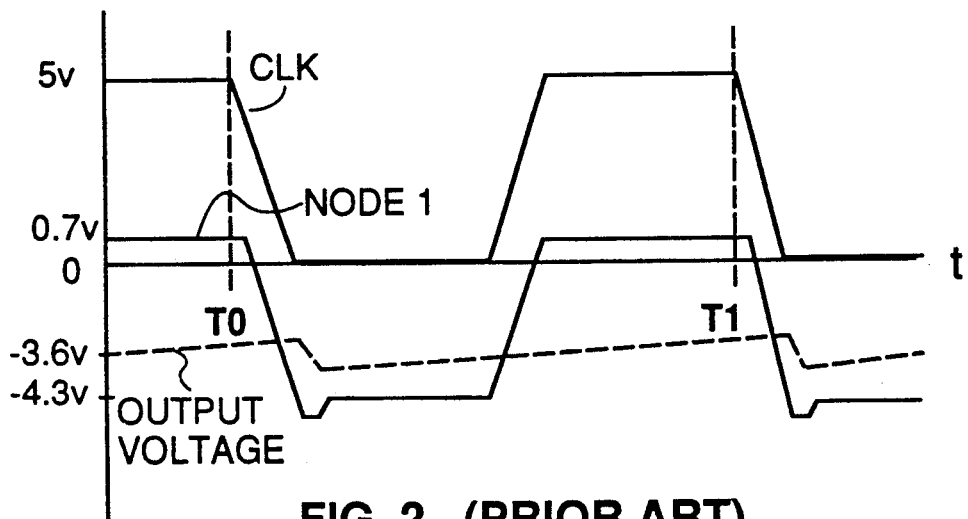
FIG. 2 shows the output ripple of the charge pump of FIG. 1.

Further, since capacitors C1 and C2 in FIG. 4 each only need to provide one-half the required charge to the load during a single period of clock signal CLK, capacitors C1 and C2 may be made one-half the capacity of the capacitors in the charge pumps of FIGS. 1 and 2. Consequently, the die area required for the charge pump of FIG. 4 is only slightly increased from the die area required for the charge pump of FIG. 1, having a relatively high ripple and requiring a relatively large capacitor C1.

Additionally, since the circuit of FIG. 4 exhibits the same input capacitance to the clock sources providing CLK and $\overline{CLK}$ and provides the same output current to the load as the circuit of FIG. 1, where C1 in FIG. 1 is twice the capacitance of either C1 or C2 in FIG. 4, the improved circuit of FIG. 4 could easily replace the prior art charge pump of FIG. 1 in existing designs.

Figure 6:
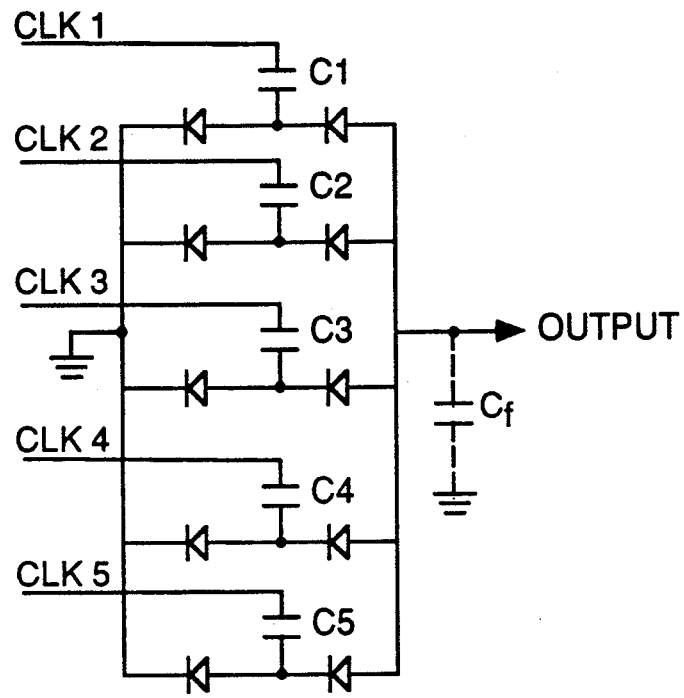
FIG. 6 shows one embodiment of the present invention using five clock signals, each having a different phase.

FIG. 6 shows a modification of the charge pump of FIG. 4, wherein five charge pumps are effectively coupled in parallel, each charge pump having a clock signal applied thereto having a phase which differs from the other clock signals. In a preferred embodiment, all clock signals CLK 1-CLK 5 have identical periods, each period being delayed approximately 72° from the prior clock signal so that during a single period of clock signal CLK 1, each of the clock signals CLK 1-CLK 5 will have gone LOW in sequence. Thus, during a single period of clock signal CLK 1, a load coupled to the output of the charge pump of FIG. 6 would have been supplied a charge by each of the capacitors C1-C5. Hence, the period of ripple at the output is one-fifth that of each of the clock signals CLK 1-CLK 5. Consequently, the magnitude of the ripple will be one-fifth of the ripple supplied by the charge pump of FIG. 1, given that each of the capacitors C1-C5 in FIG. 6 is one-fifth the capacitance of capacitor C1 in FIG. 1, and given identical filter capacitor $C_f$ values.

As is readily seen, any number of capacitors and associated diodes may be connected in parallel to effectively reduce the ripple to any level desired.

Figure 7:
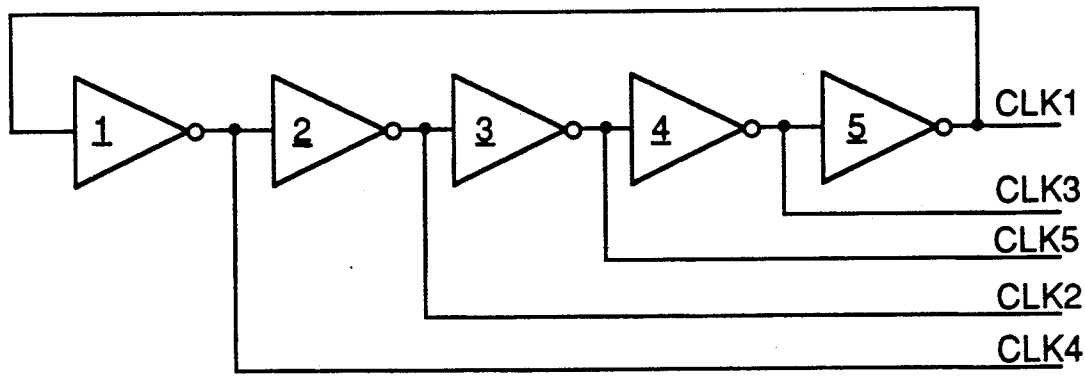
FIG. 7 shows one embodiment of a circuit to generate a number of clock signals, each having a different phase.
Figure 8:
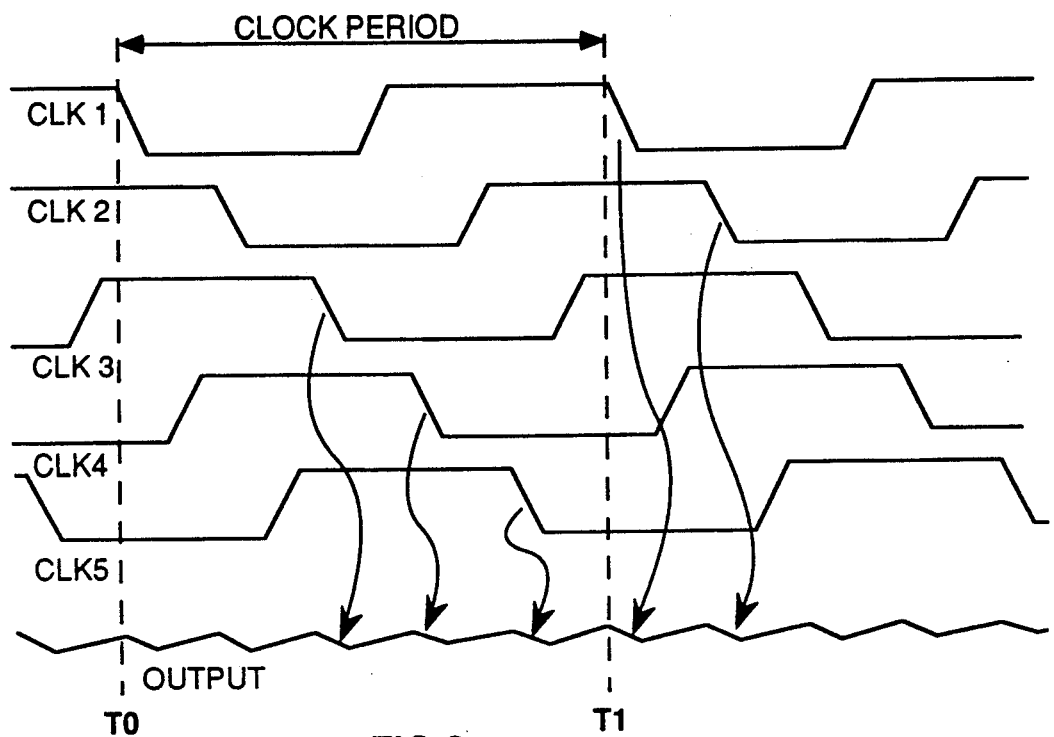
FIG. 8 shows the output voltage of the charge pump of FIG. 6 and the various clock signals applied to the capacitors in the charge pump.

Shown in FIG. 7 is one embodiment of a circuit which can be used to provide any number of clock signals having identical periods and unique phase angles. In FIG. 7, five NOT gates 1-5 are used to produce five out-of-phase clock signals having identical periods. Twice the cumulative delay of the five NOT gates determine the period of the clock signals CLK 1-CLK 5. For example, if the output of NOT gate 5, generating clock signal CLK 1, is HIGH, this HIGH signal will be applied to the input of NOT gate 1. As each NOT gate inverts and delays the signal applied to its associated input terminal, clock signals CLK 1-CLK 5 are caused to successively switch levels determined by the delays provided by each of the NOT gates 1-5. Since NOT gates 1-5 together provide a delay related to one clock period, each of the five NOT gates provides a delay equal to one-fifth of the period, thus causing each of the clock signals to be delayed by approximately 72° from the prior clock signal. This is shown in FIG. 8, where each clock signal CLK 1-CLK 5, each having a period T, is shown along with the output voltage of the charge pump. Also indicated in FIG. 8 is the ripple associated with each clock signal going LOW. As seen, the magnitude of the ripple is one-fifth of that which would be generated in the charge pump of FIG. 1.

Figure 9:
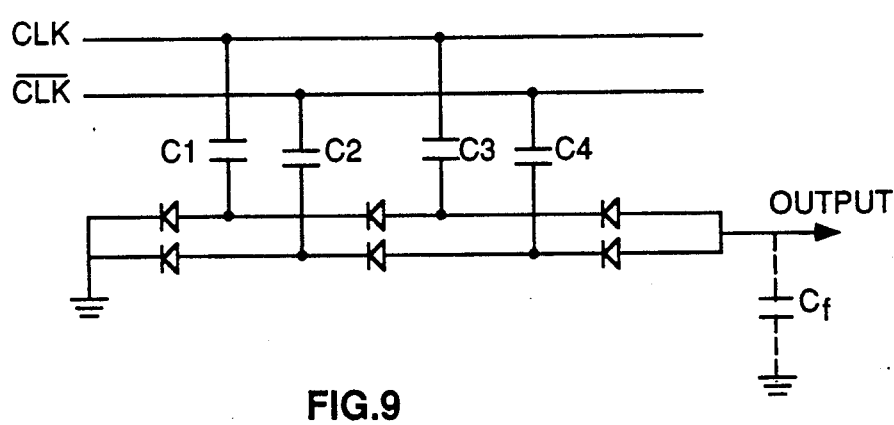
FIG. 9 shows one embodiment of a two-stage charge pump of the present invention.

FIG. 9 shows an embodiment of the invention for producing a more negative voltage than the charge pump of FIGS. 4 or 6, where the charge pump of FIG. 4 is placed in series with an identical charge pump stage, and where each stage successively causes the output voltage to become more negative. Since the capacitors (e.g., capacitors C3 and C4) in each succeeding stage will have a higher voltage across their plates, the capacitors in successive stages must be designed to handle these larger voltages. The ripple at the output of the charge pump of FIG. 9 will generally be that described with respect to FIGS. 4 and 5 for a two clock input.

Figure 10:
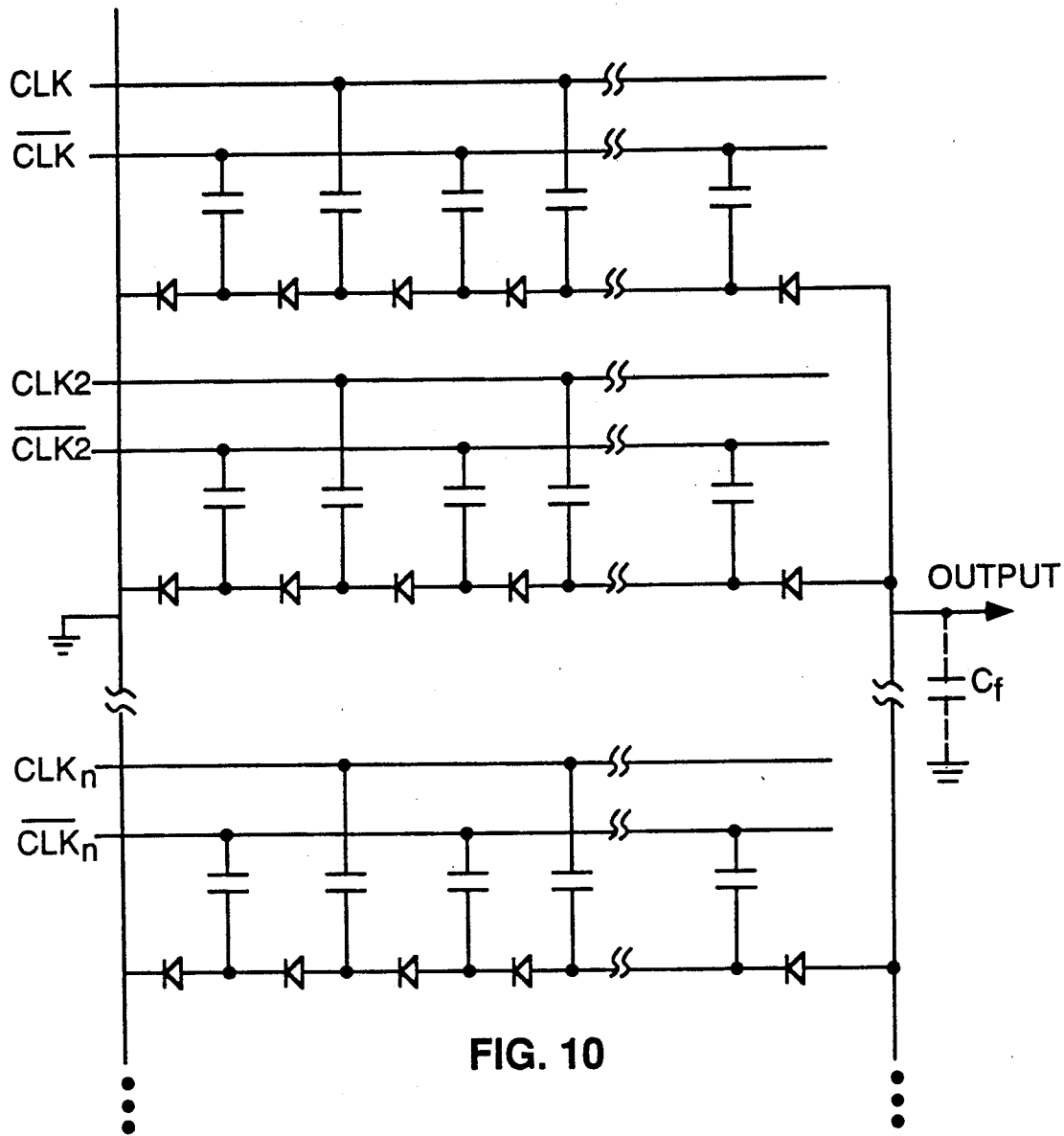
FIG. 10 shows an embodiment of the present invention having a plurality of stages and a plurality of clock signals applied thereto.

FIG. 10 shows a charge pump using the teachings of this present invention which combines multiple stages for generating a high negative voltage with multiple parallel stages for producing low ripple. In FIG. 10, clock signals CLK 1-CLK n are generated in one embodiment by a device similar to that in FIG. 7. Clock signals $\overline{CLK}$ 1-$\overline{CLK}$ n are generated simply by inverting each of the clock signals CLK 1-CLK n by an inverter having a negligible delay compared to the delay between clock phases. Thus, in FIG. 10, each of the multiple stage charge pumps associated with a single clock signal and its complement provides a portion of the charge to a load coupled to the output of the charge pump so that the magnitude of the ripple at the output is 1/n of that which would be exhibited in a charge pump such as that shown in FIG. 3, given identical filter capacitors $C_f$.

Figure 11:
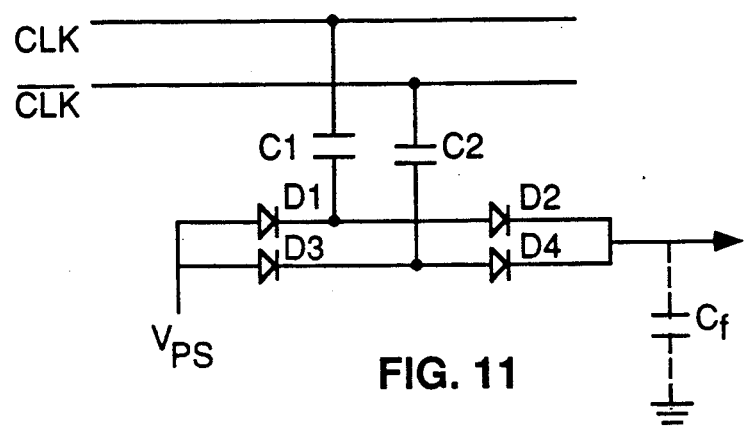
FIG. 11 shows one embodiment of the invention for generating a positive voltage.

A charge pump similar to the charge pumps of FIGS. 4, 6, 9, and 10 may be easily manufactured for producing positive voltages instead of negative voltages. An example of a charge pump in accordance with this invention for producing a positive voltage is shown in FIG. 11. The charge pump of FIG. 11 differs from the charge pump of FIG. 4 in that the connections of diodes D1-D4 are reversed so as to allow the bottom plates of capacitors C1 and C2 to become charged through diodes D1 and D3, respectively, during the time when clock signals CLK and $\overline{CLK}$ are LOW.

In operation, when CLK goes LOW, diode D1 becomes forward biased, and the electric field generated across the plates of capacitor C1 causes an accumulation of charges on the plates of capacitor C1. When CLK then goes HIGH, the increased voltage at the bottom plate of capacitor C1 causes diode D2 to become forward biased and filter capacitor $C_f$ is recharged to the maximum positive voltage.

Charging and discharging of capacitor C2 is similar to capacitor C1 but controlled by $\overline{CLK}$. Thus, as in the charge pump of FIG. 4, the resulting positive voltage ripple is one-half that of the prior art charge pump of FIGS. 1 or 3.

Using the techniques described herein, any number of stages to provide the desired voltage level, combined with any number of parallel charge pump configurations for providing low ripple, may be implemented by a designer. Any device which exhibits a capacitance, such as a FET or diode may be substituted for the capacitors used in the preferred embodiments. Further, any non-linear device may be substituted for the diodes used in the preferred embodiments.

Various embodiments and applications of the invention will become obvious to those of ordinary skill in the art. However, the invention is intended to encompass any modification of the invention which uses the various broad concepts taught with respect to the preferred embodiments.

What is claimed is:

1. A structure for providing a second potential below an input potential comprising:
   a plurality of charge pumps connected in parallel, each charge pump being coupled to receive an associated clock signal and its complement, each associated clock signal having a different phase, each charge pump comprising,
   a plurality of stages including a first and a last stage, each of said stages having an input terminal being a second terminal of a capacitive means and an output terminal being an anode of an associated non-linear device, a cathode of said associated non-linear device being coupled to said second terminal of said capacitive means, a first terminal of said capacitive means being coupled to receive either said associated clock signal or its complement,
   said plurality of stages being serially connected such that said output terminal of each stage, except said last stage, is coupled to the input terminal of a succeeding stage,
   the input terminal of said first stage of each of said plurality of charge pumps being coupled to an anode of an additional non-linear device, a cathode of said additional non-linear device being coupled to receive said input potential, wherein said first terminal of said capacitive means associated with alternate stages is coupled to receive said associated clock signal, and wherein a first terminal of said capacitive means associated with stages adjacent said alternate stages is coupled to receive said clock signal complementary to said associated clock signal, an anode of said non-linear device associated with each last stage being coupled together for providing said second potential below said input potential.

2. The structure of claim 1 wherein each of said non-linear devices is a diode.

3. The structure of claim 1 wherein said associated clock signals have substantially identical periods.

4. A structure for providing a second potential above an input potential comprising:

a plurality of charge pumps connected in parallel, each charge pump being coupled to receive an associated clock signal and its complement, each associated clock signal having a different phase, each charge pump comprising, a plurality of stages including a first and a last stage, each of said stages having an input terminal being a second terminal of a capacitive means and an output terminal being a cathode of an associated non-linear device, an anode of said associated non-linear device being coupled to said second terminal of said capacitive means, a first terminal of said capacitive means being coupled to receive either said associated clock signal or its complement, said plurality of stages being serially connected such that said output terminal of each stage, except said last stage, is coupled to the input terminal of a succeeding stage, the input terminal of said first stage of each of said plurality of charge pumps being coupled to a cathode of an additional non-linear device, an anode of said additional non-linear device being coupled to receive said input potential, wherein said first terminal of said capacitive means associated with alternate stages is coupled to receive said associated clock signal, and wherein a first terminal of said capacitive means associated with stages adjacent said alternate stages is coupled to receive said clock signal complementary to said associated clock signal, a cathode of said non-linear device associated with each last stage being coupled together for providing said second potential above said input potential.

5. The structure of claim 4 wherein each of said non-linear devices is a diode.

6. The structure of claim 4 wherein said associated clock signals have substantially identical periods.

* * * * *